United States Patent
Burress et al.

(10) Patent No.: US 10,151,192 B2
(45) Date of Patent: Dec. 11, 2018

(54) METHODS AND SYSTEMS FOR REAL-TIME MONITORING AND PROCESSING OF WELLBORE DATA

(71) Applicant: Halliburton Energy Services, Inc., Houston, TX (US)

(72) Inventors: Charlotte N. Burress, Seabrook, TX (US); Clint C. Galliano, Houma, LA (US); Peter Gonzalez, Tomball, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 295 days.

(21) Appl. No.: 14/982,707

(22) Filed: Dec. 29, 2015

(65) Prior Publication Data

US 2016/0108714 A1  Apr. 21, 2016

Related U.S. Application Data

(62) Division of application No. 13/465,809, filed on May 7, 2012, now Pat. No. 9,255,473.

(51) Int. Cl.
| | |
|---|---|
| *E21B 44/00* | (2006.01) |
| *E21B 45/00* | (2006.01) |
| *G06F 17/50* | (2006.01) |
| *G06F 17/18* | (2006.01) |
| *E21B 47/06* | (2012.01) |
| *E21B 49/00* | (2006.01) |
| *E21B 7/00* | (2006.01) |
| *E21B 41/00* | (2006.01) |

(52) U.S. Cl.
CPC ............... *E21B 45/00* (2013.01); *E21B 7/00* (2013.01); *E21B 41/0092* (2013.01); *E21B 44/00* (2013.01); *E21B 47/065* (2013.01); *E21B 49/003* (2013.01); *G06F 17/18* (2013.01); *G06F 17/5009* (2013.01)

(58) Field of Classification Search
CPC .......... E21B 40/00; E21B 21/01; E21B 21/06; E21B 21/065
USPC ................................ 175/38, 40, 46, 50, 206
See application file for complete search history.

(56) References Cited

U.S. PATENT DOCUMENTS

| | | | |
|---|---|---|---|
| 4,794,534 A * | 12/1988 | Millheim | ................ E21B 44/00 175/40 |
| 7,172,037 B2 | 2/2007 | Dashevskiy et al. | |

(Continued)

OTHER PUBLICATIONS

International Search Report and Written Opinion issued in related PCT Application No. PCT/US2013/039092 dated Jul. 31, 2014, 10 pages.

*Primary Examiner* — Brad Harcourt
*Assistant Examiner* — David Carroll
(74) *Attorney, Agent, or Firm* — Tenley Krueger; Baker Botts L.L.P.

(57) ABSTRACT

Apparatus and methods for monitoring and processing wellbore data are disclosed. An integrated digital ecosystem comprises an applied fluid optimization specialist and one or more sensors communicatively coupled to the applied fluid optimization specialist. The applied fluid optimization specialist receives data relating to performance of subterranean operations from the one or more sensors and interprets the data received. The applied fluid optimization specialist then regulates the performance of subterranean operations based on the interpretation of the data received.

12 Claims, 7 Drawing Sheets

(56) References Cited

U.S. PATENT DOCUMENTS

| | | |
|---|---|---|
| 7,823,656 B1 | 11/2010 | Williams |
| 7,908,034 B2 | 3/2011 | Gray |
| 2007/0061081 A1 | 3/2007 | Moran |
| 2008/0197605 A1 | 8/2008 | Blaschke et al. |
| 2009/0208295 A1 | 8/2009 | Kinert et al. |
| 2011/0186353 A1 | 8/2011 | Turner et al. |
| 2011/0234230 A1 | 9/2011 | Bittar et al. |
| 2012/0097450 A1 | 4/2012 | Wessling et al. |

\* cited by examiner

Fig. 11

METHODS AND SYSTEMS FOR REAL-TIME MONITORING AND PROCESSING OF WELLBORE DATA

BACKGROUND

The present invention relates to subterranean operations and, more particularly, to apparatus and methods for monitoring and processing wellbore data.

Performance of subterranean operations entails various steps, each using a number of devices. For instance, one of the steps in performing subterranean operations is the performance of drilling operations.

Drilling operations play an important role when developing oil, gas or water wells or when mining for minerals and the like. During the drilling operations, a drill bit passes through various layers of earth strata as it descends to a desired depth. Drilling fluids are commonly employed during the drilling operations and perform several important functions including, but not limited to, removing the cuttings from the well to the surface, controlling formation pressures, sealing permeable formations, minimizing formation damage, and cooling and lubricating the drill bit. Similarly, completion fluids may be used when performing subterranean operations.

It is important to monitor the performance of subterranean operations to ensure they satisfy job requirements and meet safety standards. For instance, a mud engineer at the rig site may perform a number of tests each day. These tests are well known to those of ordinary skill in the art and will therefore not be discussed in detail herein. The mud engineer may report results of tests that are performed several times per day in a single mud report reflecting the status of operations. Additionally, various sensors may provide pieces of data regarding different aspects of the operations being performed. However, the information obtained from various components is currently not integrated into a central intelligent system which is capable of processing the information received and optimizing system performance. Therefore, current methods and systems fail to optimize the overall system performance in real-time.

For instance, the mud engineer typically sends the mud report to a technical professional in an office which may be remotely located. The technical professional and the mud engineer will then analyze the report in order to address any problems reflected therein. Typically, the mud report provides information regarding the properties of the drilling fluid at the surface. That information may then be used to model the subterranean operation. However, by the time a problem is identified, the mud report may already be several hours old. As a result, the mud report and the corresponding data generated regarding the subterranean operation using that report may not be indicative of the operations at the exact point in time. Moreover, the delay in identification and remedy of any potential problems adversely impacts the performance of the subterranean operations.

SUMMARY

The present invention relates to subterranean operations and, more particularly, to apparatus and methods for monitoring and processing wellbore data.

In one embodiment, the present disclosure is directed to an integrated digital ecosystem comprising: an applied fluid optimization specialist; one or more sensors communicatively coupled to the applied fluid optimization specialist; wherein the applied fluid optimization specialist receives data relating to performance of subterranean operations from the one or more sensors; wherein the applied fluid optimization specialist interprets the data received from the one or more sensors; and wherein the applied fluid optimization specialist regulates the performance of subterranean operations based on the interpretation of the data received.

In another embodiment, the present disclosure is directed to a method of optimizing performance of subterranean operations comprising monitoring performance of a subterranean operation; determining whether the subterranean operation is being performed at an optimal level; identifying one or more causes for the subterranean operation not being performed at an optimal level; and generating an intervention if the subterranean operation is not being performed at an optimal level, wherein level of intervention depends on the one or more causes for the subterranean operation not being performed at an optimal level.

In yet another embodiment, the present invention is directed to a method of optimizing performance of a subterranean operation comprising:

providing one or more sensors; wherein the one or more sensors gather data relating to performance of the subterranean operation; monitoring data gathered by the one or more sensors to identify one or more operational conditions; identifying need for an intervention based on the one or more identified operational conditions; determining an intervention level based on the gathered data; generating an intervention corresponding to the determined intervention level; and responding to the intervention based on the intervention level.

The features and advantages of the present invention will be apparent to those skilled in the art from the description of the preferred embodiments which follows when taken in conjunction with the accompanying drawings. While numerous changes may be made by those skilled in the art, such changes are within the spirit of the invention.

BRIEF DESCRIPTION OF THE DRAWINGS

These drawings illustrate certain aspects of some of the embodiments of the present invention, and should not be used to limit or define the invention.

While embodiments of this disclosure have been depicted and described and are defined by reference to example embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

Illustrative embodiments of the present invention are described in detail herein. In the interest of clarity, not all features of an actual implementation may be described in this specification. It will of course be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

The terms "couple" or "couples," as used herein are intended to mean either an indirect or a direct connection. Thus, if a first device couples to a second device, that connection may be through a direct connection, or through an indirect electrical connection via other devices and connections. The term "communicatively coupled" as used herein is intended to mean coupling of components in a way to permit communication of information therebetween. Two components may be communicatively coupled through a wired or wireless communication network. Operation and use of such wired and wireless communication networks is well known to those of ordinary skill in the art and will, therefore, not be discussed in detail herein. The term "upstream" as used herein means along a flow path towards the source of the flow, and the term "downstream" as used herein means along a flow path away from the source of the flow. The term "uphole" as used herein means along the drillstring or the hole from the distal end towards the surface, and "downhole" as used herein means along the drillstring or the hole from the surface towards the distal end.

It will be understood that the term "oil well drilling equipment" or "oil well drilling system" is not intended to limit the use of the equipment and processes described with those terms to drilling an oil well. The terms also encompass drilling natural gas wells or hydrocarbon wells in general. Further, such wells can be used for production, monitoring, or injection in relation to the recovery of hydrocarbons or other materials from the subsurface. This could also include geothermal wells intended to provide a source of heat energy instead of hydrocarbons.

The present invention relates to subterranean operations and, more particularly, to apparatus and methods for monitoring and processing wellbore data.

Figure 1:
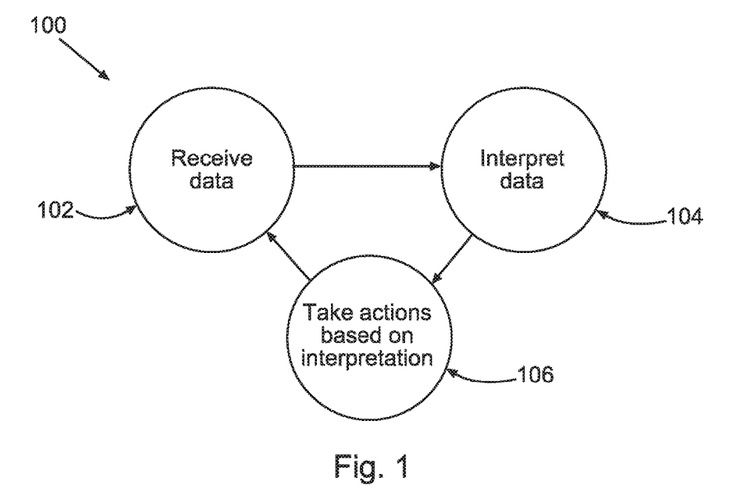
FIG. 1 depicts general method steps in accordance with an exemplary embodiment of the present disclosure.

Turning now to FIG. 1, general method steps in accordance with an exemplary embodiment of the present disclosure are denoted with reference numeral 100. First, at step 102, the data generated in real-time by the different components involved in performance of subterranean operations is obtained. This data may be obtained manually or automatically using one or more sensors. Next, at step 104, the obtained data is interpreted. In certain embodiments, one or more mathematical models may use the obtained data and generate a set of simulated data that can be compared with the actual data. Once the data is interpreted, at step 106, one or more aspects of the subterranean operations may be modified in view of that interpretation in order to optimize overall system performance, meet safety guidelines, or otherwise comply with preset operator preferences. In certain embodiments, a comparison of the simulated data and the actual data may be used to optimize the operational performance of the system.

Figure 2:
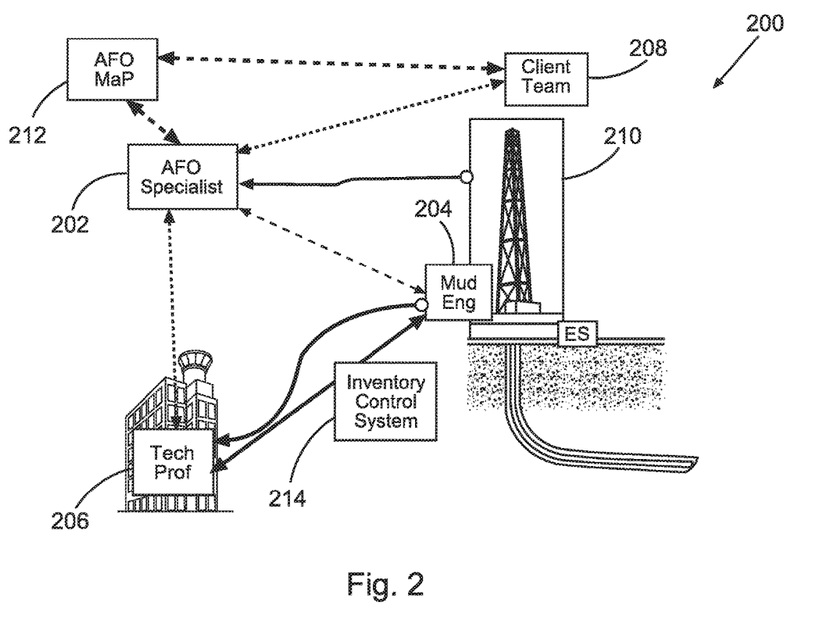
FIG. 2 depicts an Integrated Digital Ecosystem ("IDE") in accordance with an exemplary embodiment of the present disclosure for performing the method steps of FIG. 1.

FIG. 2 depicts an Integrated Digital Ecosystem ("IDE") in accordance with an exemplary embodiment of the present disclosure for performing the method steps of FIG. 1, denoted generally with reference numeral 200. In certain embodiments, the IDE 200 may perform the steps identified with reference to FIG. 1 as discussed in more detail below.

Specifically, the IDE 200 may include an Applied Fluid Optimization ("AFO") specialist 202 which may act as a central unit for receiving data relating to subterranean operations, interpreting that data, and modifying the performance of the subterranean operations in response. The AFO specialist 202 may intercept a range of useful data relating to the performance of subterranean operations in real-time from the rig site 210. The "useful data" may include, but is not limited to, one or more of the hole depth, the bit depth, the block position, the hookload, the True Vertical Depth ("TVD"), time/date activity, the temperature, density and/or flow of fluid(s) directed into one or more components performing the subterranean operations, density and/or flow of fluid(s) flowing out of one or more components performing the subterranean operations, the Riser flow in, the stand pipe pressure, the rotary Rotations Per Minute ("RPM"), torque, choke pressure, bottom hole temperature ("BHT"), rate of penetration ("ROP"), the running speed, Pressure While Drilling ("PWD") Equivalent Mud Weight ("EMW"), pit volumes, and pit volume change. As would be appreciated by those of ordinary skill in the art, with the benefit of this disclosure, the useful data provides the AFO specialist 202 with a snapshot of the ongoing subterranean operations in real-time.

In certain embodiments, the mud engineer 204, the technical professional 206 and/or the client team 208 may have access to the AFO specialist 202 through a wired or wireless network. Additionally, the AFO specialist 202 may provide an interface for communication of data and instructions between the mud engineer 204, the technical professional 206 and the client team 208, allowing collaboration therebetween when performing the subterranean operations. Further, in certain embodiments, the IDE 200 may provide a direct communication line between the mud engineer 204 and the technical professional 206 in order to permit transfer of data and instructions therebetween, bypassing the AFO specialist 202.

In certain embodiments, the AFO specialist 202 may also be communicatively coupled to the AFO Modeling and Planner ("MaP") 212. The AFO MaP 212 is an AFO subsystem which is responsible for developing an execution plan prior to performance of subterranean operations. Accordingly, the AFO MaP 212 may plan the well in advance of the actual execution of the drilling operations. Specifically, this AFO specialist may complete an in depth hydraulics modeling of the fluid, along with geomechanical analysis and planning of lost circulation corrective actions. In certain embodiments, the AFO MaP 212 may interface with the execution AFO specialist 202 by communicating the prepared plans to the AFO specialist 202 and/or using the information gathered by the AFO specialist 202 during the planning stage.

Additionally, the AFO specialist 202 may be communicatively coupled to a number of components used in performance of the subterranean operations to permit communication of real-time data relating to the subterranean operations to the AFO specialist 202. In certain embodiments, the AFO specialist 202 may monitor an inventory control system 214. The tracking of the inventory control system 214 may be based on a real-time tracking of one or more desired materials such as, for example, chemical inventory. The tracking of the chemical inventory may entail using load sensors to monitor the amount of chemicals used, the rate of use of chemicals, etc. In one embodiment, the inventory control system may inform the AFO specialist 202 if the amount of one or more chemicals falls below a threshold value and needs to be replenished.

In certain embodiments, during drilling operations, the drilling fluid may return cuttings from the subterranean formation to the surface. These cuttings may be analyzed and the cuttings' characterization may be used to learn about the characteristics of the formation being drilled. In one embodiment, information relating to the cuttings' characterization may be communicated from the rig site 210 to the AFO specialist 202. Specifically, using sensor technology at the rig site 210 based on particle size distribution ("PSD") of the cuttings, density of the cuttings, visual characteristics of the cuttings captured by a camera and/or other parameters, the cuttings from the drilling operation may be evaluated and entered into a decision making matrix program or AFO specialist 202 workflow to determine if further fluid treatments are required. Similarly, in cuttings reinjection operations, the cuttings may be characterized and the slurries evaluated using automated density and viscosity measurements.

Similarly, other information relating to drilling performance and fluid performance may be communicated to the AFO specialist 202. Additionally, information relating to waste tracking and the performance of the dosing system may be communicated to the AFO specialist 202 from the rig site 210. Accordingly, the AFO specialist 202 may control and/or monitor fluid waste for optimization of waste capacity and/or an automated dosing system for the addition of chemicals into the drilling or completion fluid. Moreover, in certain embodiments, the density and/or viscosity of cuttings from reinjection wells may be measured and communicated to the AFO specialist 202 from the rig site 210. In certain embodiments, the dosing system may be controlled by the AFO specialist 202 to facilitate addition of chemicals to a drilling or completion fluid when data received by the AFO specialist 202 shows that the concentration of the particular chemical has fallen below an optimal threshold value.

In addition to the data generated from the general drilling operations, the AFO specialist 202 will also receive data from automated equipment that measure drilling fluid properties. Such automated equipment measurements may include, but are not limited to, measurements relating to density, viscosity, Particle Size Distribution ("PSD"), oil/water ratio, electrical stability, percentage of solid content, Chloride concentration, Cation concentration, and pH. In one embodiment, the AFO specialist 202 may be an information handling system or may be communicatively coupled to an information handling system to facilitate processing and/or storing the data received as well as issuing commands to regulate the performance of the subterranean operations. The information handling system may include computer readable instructions (referred to herein as a "software application") that enable it to store the generated useful data, interpret the useful data, and act on the useful data as noted in FIG. 1. The information handling system may also include computer-readable media.

Specifically, the useful data received by the AFO specialist 202 may be directed to the information handling system which will utilize preset parameters to determine if an issue in the operation is about to occur. For instance, in certain embodiments, preset parameters may relate to certain sensor readings. Specifically, the AFO specialist 202 may be designed to identify an upcoming issue with the ongoing operations if readings of certain sensors fall below or raise above a predetermined threshold value.

Figure 3:
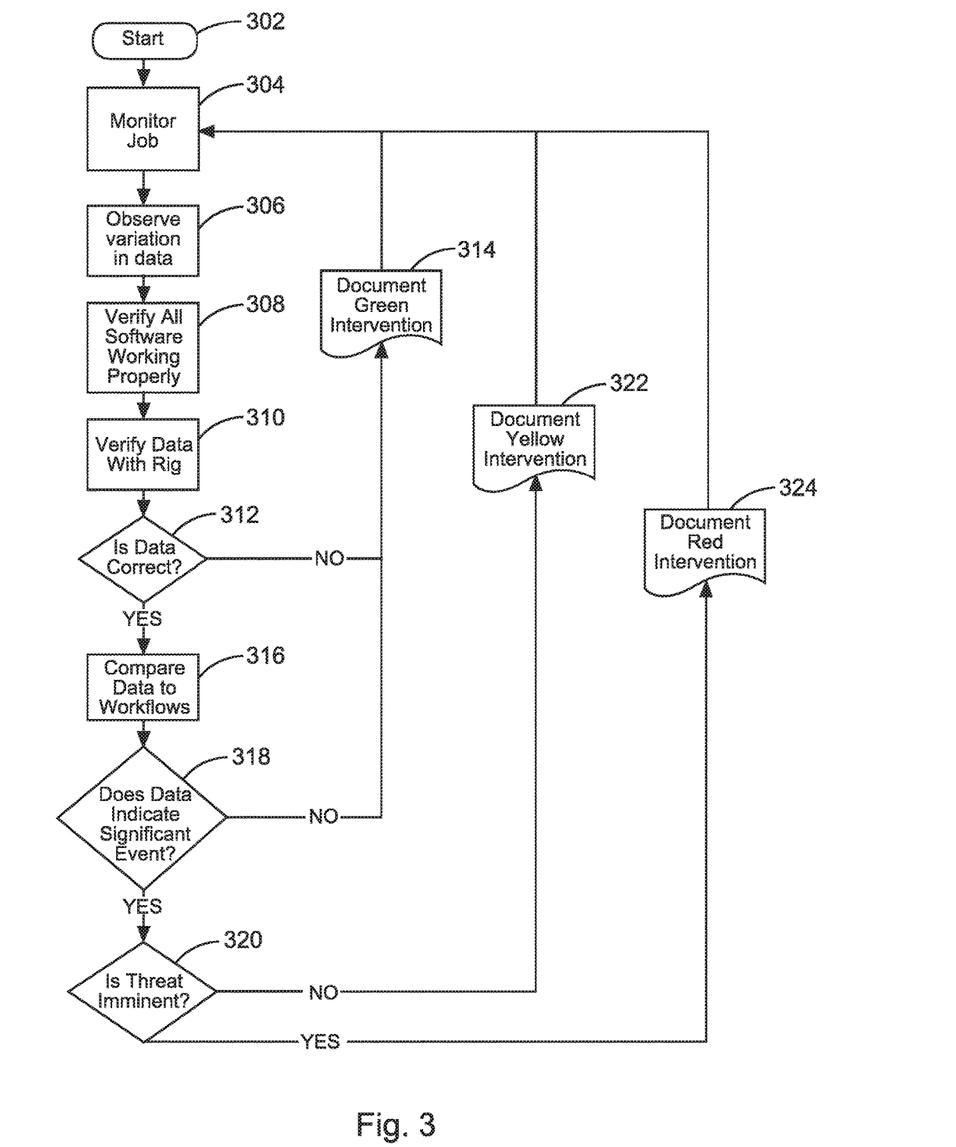
FIG. 3 depicts an exemplary AFO intervention workflow in accordance with an embodiment of the present disclosure.

Turning now to FIG. 3, the general AFO workflow intervention method in accordance with an exemplary embodiment of the present disclosure is denoted with reference numeral 300. The AFO specialist 202 may utilize this workflow method to optimize overall system performance when performing different operations in conjunction with performance of subterranean operations. Generally, the AFO workflow intervention method may generate different levels of intervention depending on the type of system failure identified by the system components. In one embodiment, the AFO specialist 202 may generate three different interventions that may be denoted as green intervention, yellow intervention, and red intervention, respectively, depending on the level of importance and the required response. A green intervention may denote a low level intervention and may be a normal communication to verify sensor values, operations, or clarify report entries and may probe the system to continue to monitor the condition that raised the intervention. A yellow intervention may denote a medium level intervention and may be indicative of a condition that could lead to a significant event. For instance, the condition giving rise to the yellow intervention may be one that can potentially become a management system hazard or an operational hazard. When a yellow intervention is generated, the system may further compile a list of mitigation options to resolve the condition. Moreover, in certain embodiments, the system may notify the operator of the condition that gave rise to the yellow intervention and may also contact the rig to discuss mitigation options. Once a yellow intervention is generated, the system may continue to monitor the particular condition that gave rise to the intervention for potential escalation to red intervention. Examples of conditions giving rise to a yellow intervention may include, but are not limited to, Surge/Swab approaching preset limits, elevated predicted cuttings loading, or elevated predicted Equivalent Circulating Density ("ECD").

Finally, a red intervention may denote a high level intervention and may be indicative of a significant adverse event. As a result, once a red intervention is generated the rig may be contacted immediately to discuss mitigation options and the operator may also be informed. The system will then continue to monitor the condition giving rise to the red intervention while the problem is being resolved or mitigated. Examples of conditions giving rise to a red intervention may include, but are not limited to, gas influx, Pack-Off, lost returns, or instances when Surge/Swab exceeds preset limits.

As shown in FIG. 3, the AFO intervention workflow process starts at step 302 and subterranean operation of interest (i.e. "the job") is monitored at step 304. As discussed in more detail below, once the AFO determines that the particular subterranean operation is not being performed at the optimal level, it may identify one or more issues that are preventing optimal performance. The AFO may then generate an intervention to correct or mitigate issues that are adversely affecting the performance of the subterranean operation. Variations in data are observed at step 306 and at step 308, it is verified that the software application used to generate information based on rig data is working properly. Next, at step 310, the data obtained from the software application is verified with data from the rig. Next, at step 312, it is determined whether the data obtained is correct based on a comparison with the rig data. If the data obtained is not correct, a green intervention is documented at step 314 and the process returns to step 304. In contrast, if it is determined at step 312 that the data is correct, the process proceeds to step 316 where the data is compared to workflows. Next, at step 318 it is determined whether the data indicates a significant event. If no significant event is detected a green intervention is documented at step 314 and the process returns to step 304. If a significant event is detected at step 318, the process proceeds to step 320 to determine whether the significant event is one that is likely to cause immediate threat. If the event is one that is not likely to cause an immediate threat, a yellow intervention is documented at step 322 and the process returns to step 304 and is repeated. As discussed above, in conjunction with documenting a yellow intervention, the system may communicate the threat to a designated Point of Contact ("PoC") and the system may continue to monitor the condition that gave rise to the intervention to determine if a red intervention is needed. The PoC may be any entity designated as such by the system. If at step 320 it is determined that the significant event is one that is likely to cause immediate threat, the process may proceed to step 324 and a red intervention may be documented. As discussed above, upon documenting a red intervention, the system may communicate the threat and mitigation recommendations to a designated PoC and continue to monitor the condition while the problem is being resolved or mitigated.

Accordingly, the AFO specialist 202 may identify a number of conditions that may be of interest to an operator. For instance, the AFO specialist 202 may identify poor hole cleaning, a Pack Off situation, fracturing the wellbore or drilling fluid loss to the formation. Once an issue is identified by the AFO specialist 202, the AFO specialist 202 may communicate the identified issue to the mud engineer 204, the technical professional 206, and/or the client team 208. In certain embodiments, the AFO specialist 202 may keep track of the different issues that come up during the performance of the subterranean operations in a computer-readable media. The information stored in the computer-readable media may be used to keep track of the different issues that have come up during the performance of subterranean operations in real-time. As would be appreciated by those of ordinary skill in the art, with the benefit of this disclosure, each of the issues identified by the AFO specialist 202 requires a specific response from the operator in response to documentation of an intervention level. A few exemplary issues that may come up when performing subterranean operations and that may be resolved by the AFO specialist 202 will now be discussed in conjunction with FIGS. 4-11. Specifically, FIGS. 4-11 disclose exemplary subsystem operations that may benefit from the AFO intervention workflow of FIG. 3. However, as would be appreciated by those of ordinary skill in the art, the application of the methods and systems disclosed herein is not limited to these specific examples. Specifically, as would be appreciated by those of ordinary skill in the art, with the benefit of this disclosure, the same methods and systems may be applicable to other aspects of performance of subterranean operations without departing from the scope of the present disclosure.

Figure 4:
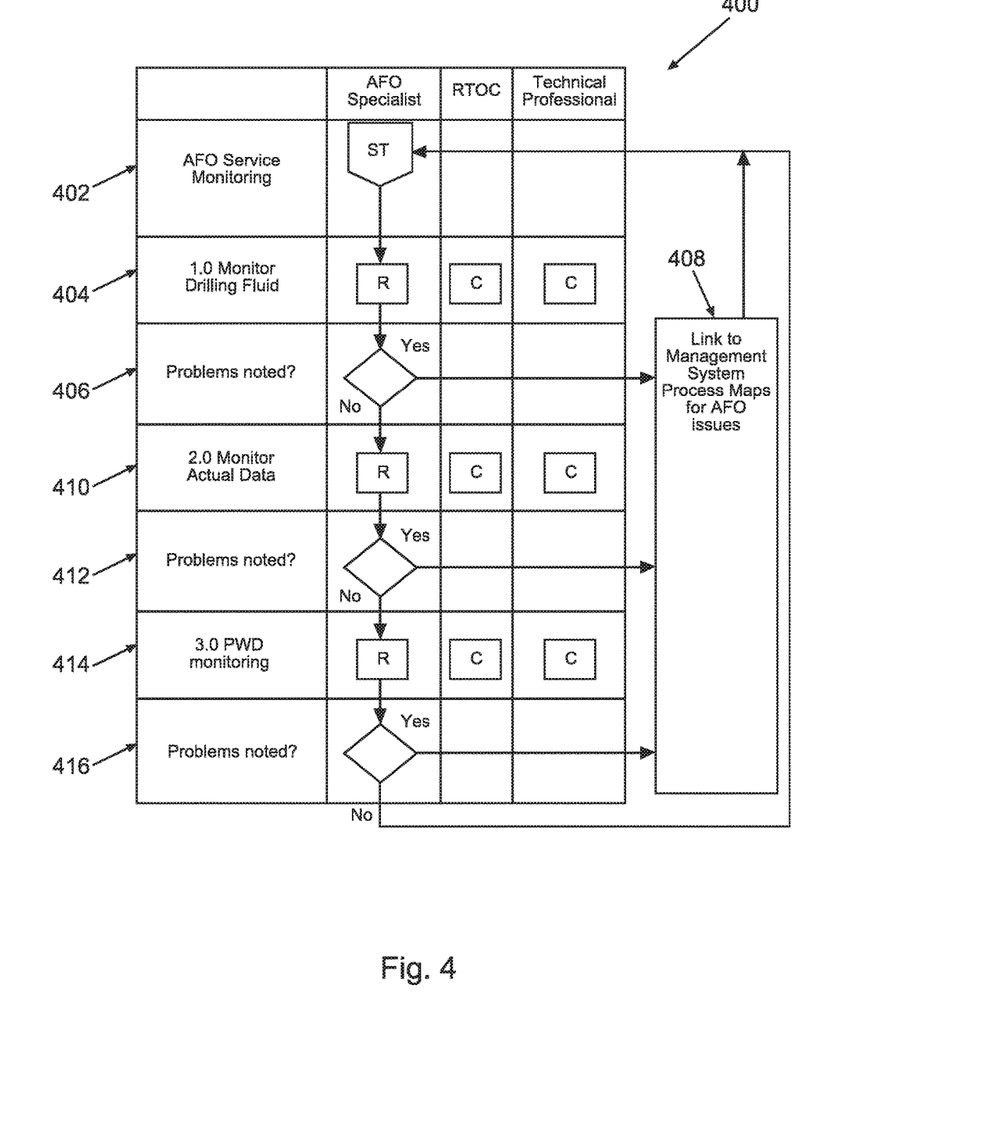
FIG. 4 depicts an AFO service for monitoring drilling operations workflow in accordance with an exemplary embodiment of the present disclosure.

Turning now to FIG. 4, an AFO service monitoring drilling operations workflow in accordance with an exemplary embodiment of the present disclosure is denoted generally with reference numeral 400. The AFO service monitoring is initiated by the AFO specialist at step 402. Next, at step 404, the drilling fluid properties are monitored. The AFO specialist is responsible for monitoring the drilling fluid properties and consults with the Real-Time Operations Center ("RTOC") and the Technical Professional. The drilling fluid properties may be used by the AFO specialist to predict characteristics of the subterranean formation. In one embodiment, the AFO specialist may utilize a software application and an information handling system to predict such characteristics. The use of information handling systems and software applications to predict subterranean formation characteristics based on drilling fluid properties is well known to those of ordinary skill in the art and will therefore not be discussed in detail herein. The predicted characteristics may include, but are not limited to, downhole pressures, mud weight, and DrillAhead™ hydraulics ("DAH"). At step 406, the AFO specialist determines whether the values obtained at step 404 suggest any problems or issues with the ongoing subterranean operations. In certain embodiments, this determination may be based on whether the obtained value is below or exceeds a preset threshold value. If so, the AFO specialist links to the management system process maps for AFO issues at step 408 and reports the problem. The management system will then take appropriate actions and generate the appropriate intervention using the AFO intervention workflow to handle the issues identified and the process returns to step 402 and is repeated. If no issues are identified at step 406, the process proceeds to step 410 where the AFO specialist is responsible for monitoring actual data from the well site and consults with the RTOC and the technical professional in the process. This actual data may include, but is not limited to, the flow in, the standpipe pressure, the unit of gas, rate of penetration ("ROP"), and/or Torque. The process then proceeds to step 412 to determine whether the obtained values suggest any problems with the performance of the subterranean operations. In certain embodiments, this determination may be based on whether the obtained value is below or exceeds a preset threshold value. If any issues are identified, the AFO specialist may report the problem to the management system at step 408 and the process proceeds to step 402. If no problems are noted, the process may proceed to step 414.

At step 414, the AFO specialist may be responsible for monitoring the pressure while drilling ("PWD") and may consult with the RTOC and the technical professional in the process. The data monitored by the AFO specialist may include, but is not limited to pressure values, equivalent mudweight ("EMW") values and/or the surge/swab values.

At step 416, the AFO specialist determines whether the values obtained at step 414 suggest any problems or issues with the ongoing subterranean operations. In certain embodiments, this determination may be based on whether the obtained value is below or exceeds a preset threshold value. If so, the AFO specialist links to the management system at step 408 and reports the problem. The management system will then take appropriate actions and generate the appropriate intervention using the AFO intervention workflow to handle the issues identified and the process repeats to step 402.

Figure 5:
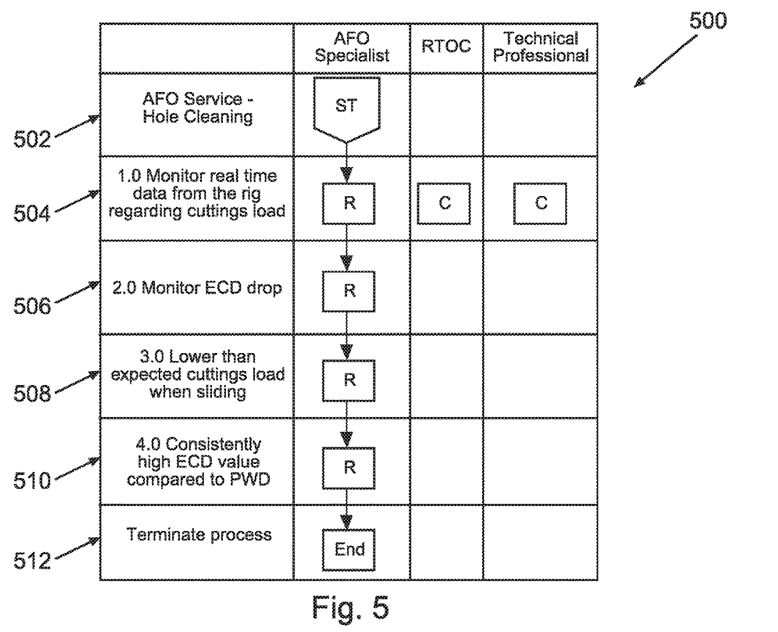
FIG. 5 depicts an AFO service for monitoring hole cleaning workflow in accordance with an exemplary embodiment of the present disclosure.

Turning now to FIG. 5, an AFO service monitoring hole cleaning operations in accordance with another exemplary embodiment of the present disclosure is denoted generally with numeral 500. This process map defines AFO services concerning hole cleaning issues. The hole cleaning process starts at step 502. Next at step 504, the AFO specialist monitors the real-time data from the rig regarding cuttings load and consults with the RTOC and the Technical Professional. Specifically, at step 504, the AFO specialist may confirm that data is transmitted and received correctly. For instance, the AFO specialist may run an instance of DAH while changing parameters known to affect hole cleaning such as pump rate, ROP, RPM, and circulation time. The AFO specialist may then communicate information based upon this analysis. Next, at step 506, the AFO specialist may monitor Equivalent Circulation Density ("ECD"). Specifically, the ECD typically drops drastically after connection and climbs continually while drilling. The AFO specialist may verify that the real-time data is tracking residual cuttings when the bit is off the bottom of the wellbore. The AFO specialist may also observe the residual cuttings column. Next, at step 508, the AFO specialist may check the real-time data from the drilling activity and verify whether that data is correct. Specifically, the cuttings load may be lower than expected when the rig is sliding. In such instances, the real-time data relating to drilling activity may be incorrect and may display information indicating a rotating drilling operation when the rig is actually sliding. If that happens, the AFO specialist may run the RPM calculator to correct the issue. Finally, at step 510 a consistently high ECD value is compared to PWD to verify that the inputs of the information handling system generating the real-time data are correct. Additionally, at step 510, the AFO specialist will verify that the data generated by the wellsite application software is correct. Finally, the AFO specialist may observe the units of wellbore gas and may analyze the formation being drilled and adjust the cuttings' Specific Gravity ("SG") if necessary. If at any point during the process set forth in FIG. 5 the AFO specialist identifies an issue that may give rise to potential or immediate threats, the process may be directed to the AFO intervention workflow of FIG. 3 and an appropriate intervention signal may be documented.

Figure 6:
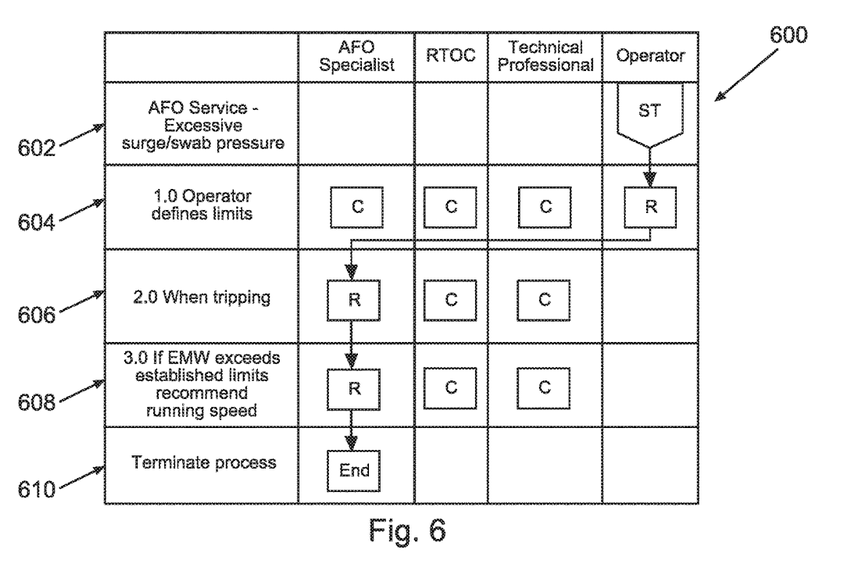
FIG. 6 depicts an AFO service for monitoring excessive Surge/Swab pressures in accordance with an exemplary embodiment of the present disclosure.

Turning now to FIG. 6, an AFO service for monitoring excessive Surge/Swab pressures is denoted generally with reference numeral 600. Specifically, during drilling process, as the drillstring moves down through the wellbore it may create a pressure which is typically referred to as a "Surge." In contrast, when the drillstring is being pulled out of the wellbore it may create a vacuum which is typically referred to as a "Swab." Accordingly, when performing subterranean operations, it is desirable to ensure that the Surge and Swab created due to movement of the drillstring does not exceed the formation limits. In accordance with an exemplary embodiment of the present disclosure, the process starts at step 602. Next, at step 604, the crossing surge and/or swab limits are defined by the operator. The operator may consult with the Technical Professional, the RTOC and/or the AFO specialist when defining these limits. At step 606, the AFO specialist runs the tripping schedule and determines maximum speed for surge (trip in) and the swab (trip out). The AFO specialist then observes EMWs to ensure they are within a safe window as determined by leak-off and pore pressure. Next, at step 608, if the EMWs exceed limits established by the operator, the AFO specialist may recommend a running speed for the drillstring to resolve the issue. The AFO specialist may consult with the RTOC and/or the Technical Professional at steps 606 and/or 608. The process then terminates at step 610. If at any point during the process set forth in FIG. 6 the AFO specialist identifies an issue that may give rise to potential or immediate threats, the process may be directed to the intervention workflow of FIG. 3 and an appropriate intervention signal may be documented.

Figure 7:
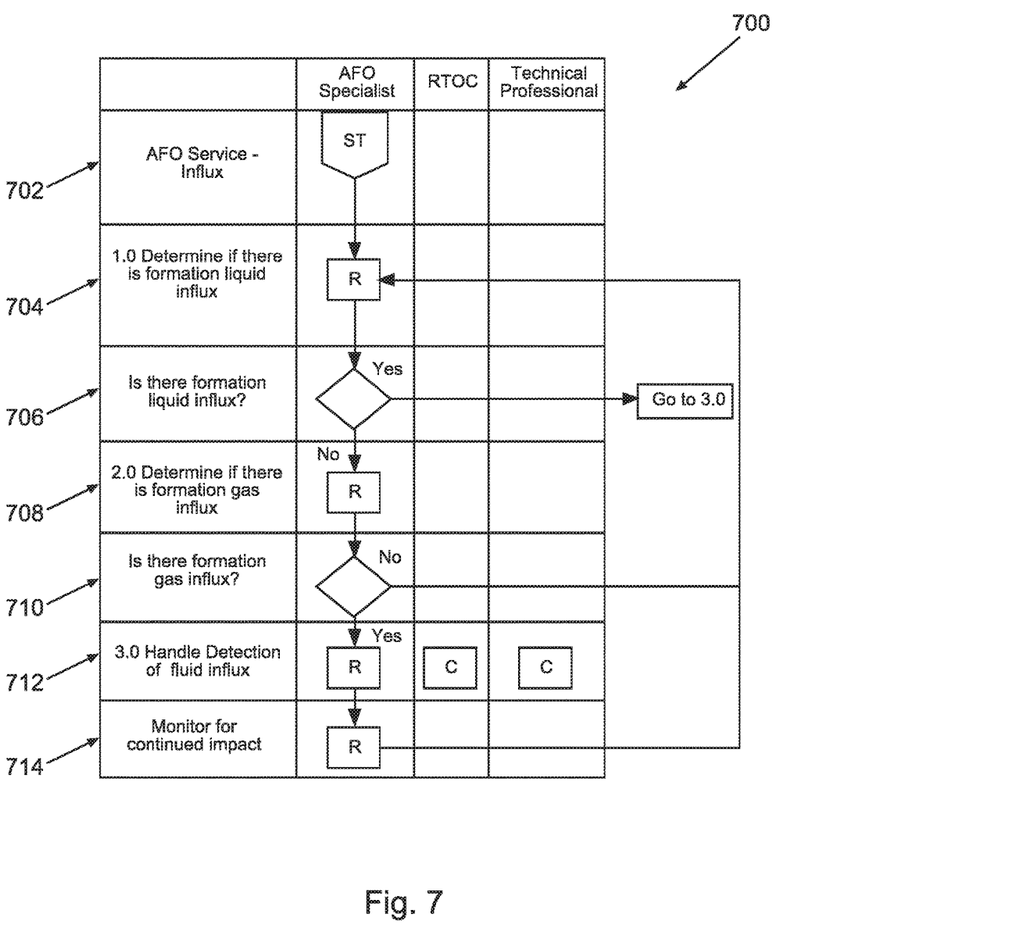
FIG. 7 depicts an AFO service for monitoring influx in accordance with an exemplary embodiment of the present disclosure.

Turning now to FIG. 7, an AFO service for monitoring influx is denoted generally with reference numeral 700. Specifically, influx refers to flow of fluids and/or gasses from the formation into the wellbore. In accordance with an embodiment of the present disclosure, an influx workflow is initiated at step 702 by the AFO specialist. Next, at step 704 the AFO specialist determines if there is a formation liquid influx. Specifically, a formation liquid influx may be detected if the PWD EMW decreases while the calculated pressure using real-time data from the rig remains almost constant. Specifically, PWD equipment measure actual pressures at the wellbore. A low rate of influx may cause a gradual decrease in EMW while a high rate of influx may cause a rapid decrease in EMW. At the same time, an information handling system may be used to calculate the pressure using rig data. The two pressures may be compared to detect an influx. In instances where the formation liquid contains a large amount of solids, the drop in the PWD EMW may not be easily detected. In certain embodiments, the AFO specialist may characterize the formation liquid influx when a continued, sustained flow is detected after the pumps are turned off. Next, at step 706 it is determined whether there is a formation liquid influx. If there is no formation liquid influx, the process continues to step 708 to determine if there is a formation gas influx and at step 710 a decision is made. If no formation gas influx is detected, the process returns to step 704.

If a formation liquid influx or a formation gas influx is detected, the process continues to step 712 to handle the fluid influx. In certain embodiments, once the influx is detected, the AFO specialist may consult with the RTOC and the Technical Professional at step 712. The proper contacts may then be notified and the data from the wellbore may be analyzed to identify possible causes of the influx. Next, at step 714, the wellbore may be monitored for continued impact of the influx and process returns to step 704. In certain embodiments, once in step 712 the AFO specialist identifies an influx, the process may be directed to the intervention workflow of FIG. 3 and an appropriate intervention signal may be documented.

Figure 8:
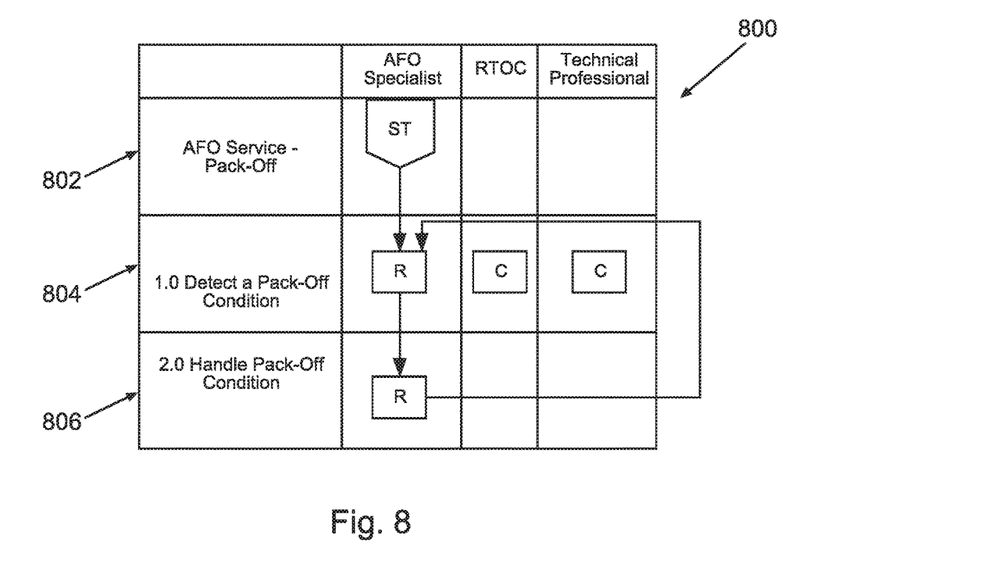
FIG. 8 depicts an AFO service for monitoring Pack-Off in accordance with an exemplary embodiment of the present disclosure.

Turning now to FIG. 8, an AFO service for monitoring Pack-Off is denoted generally with reference numeral 800. Specifically, Pack-Off refers to a closing of the annular wellbore space due to a formation collapse or a restriction of the annular wellbore space by cuttings that are removed to the surface when performing drilling operations. The process is initiated at step 802 and the AFO specialist may detect a Pack-Off at step 804. The AFO specialist may consult with the RTOC and the Technical Professional in this step. Typically, a Pack-Off event may be detected at step 804 when there is a sudden loss of the ability to circulate fluids through the wellbore annulus. The Pack-Off may also lead to high pump pressures and/or an increase in PWD ECDs. If a Pack-Off is detected, the AFO specialist may handle this condition at step 806. In certain embodiments, once in step 804 the AFO specialist identifies a Pack-Off condition, the process may be directed to the intervention workflow of FIG. 3 and an appropriate intervention signal may be documented. The process then returns to step 804 where the AFO specialist continues to monitor the subterranean operations to detect another potential Pack-Off condition.

Figure 9:
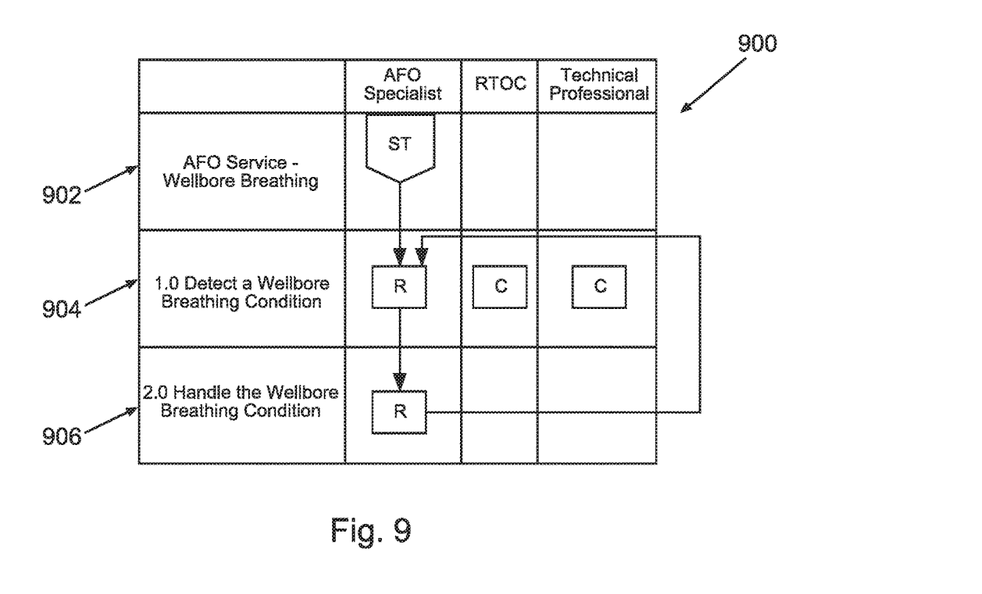
FIG. 9 depicts an AFO service for monitoring wellbore breathing in accordance with an exemplary embodiment of the present disclosure.

Turning now to FIG. 9, an AFO service for monitoring wellbore breathing is denoted generally with reference numeral 900. When performing subterranean operations, additional dynamic pressures in the wellbore may initiate formation fractures which may take on the drilling fluid. For instance, the circulation of the drilling fluid through the wellbore may create such additional fractures. Consequently, fluids may seep into these additional fractures. Wellbore breathing refers to a condition where once the pumps used in performing subterranean operations are turned off, the fluids that have seeped into these additional fractures leak back into the wellbore. Specifically, once the pumps are turned off and the pressure in the wellbore is reduced and these additional fractures close, the drilling fluid is displaced and causes a surface flow. The AFO service process is initiated at step 902, and at step 904 the AFO specialist with consultation from the RTOC and/or the Technical Professional may detect a wellbore breathing condition. A wellbore breathing condition may be detected if there is a flow back once the pumps are turned off and/or there is a pit gain above normal levels once the pumps are turned off. Moreover, when wellbore breathing occurs, the recorded PWD data may show a "rounded" pumps-off signature rather than a "square" one. Once a wellbore breathing situation is detected at step 904, the process continues to step 906 where the AFO specialist handles this condition. In certain embodiments, the process may be directed to the intervention workflow of FIG. 3 and an appropriate intervention signal may be documented once a wellbore breathing condition is identified at step 904. Once the wellbore breathing condition has been handled at step 906, the process then returns to step 904 where the AFO specialist continues to monitor the subterranean operations to detect another potential wellbore breathing condition.

Figure 10:
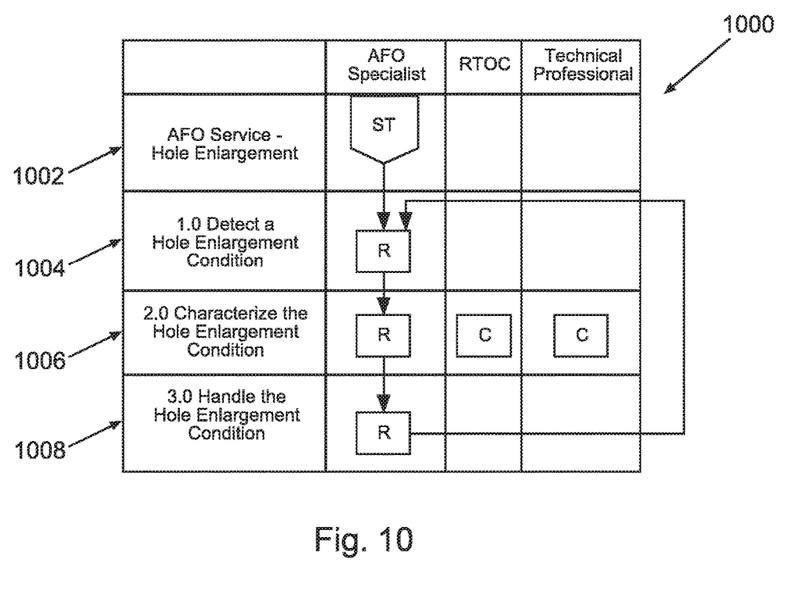
FIG. 10 depicts an AFO service for monitoring hole enlargement in accordance with an exemplary embodiment of the present disclosure.

Turning now to FIG. 10, an AFO service for monitoring hole enlargement is denoted generally with reference numeral 1000. Generally, hole enlargement or "washout" refers to an enlarged region of a wellbore. A washout is an openhole section of the wellbore which may be larger than the original hole size or size of the drill bit. Washout may be caused by a number of factors including, but not limited to, excessive bit jet velocity, soft or unconsolidated formation, in-situ rock stresses, mechanical damage by BHA components, chemical attack and swelling or weakening of shale as it contacts fresh water. In accordance with an embodiment of the present disclosure, the AFO specialist begins the AFO service for monitoring hole enlargement at step 1002 and continues monitoring to detect a hole enlargement condition at step 1004. The occurrence of a hole enlargement condition may be characterized by (1) PWD ECDs that due to frictional losses are lower than those calculated using real-time data from the rig; (2) Stand Pipe Pressure ("SPP") that is lower than the total system pressure calculated using real-time data from the rig; and/or (3) when caused by sloughing shale, a higher than expected cuttings load. Once a hole enlargement condition is detected at step 1004, the process may proceed to step 1006 to characterize the condition. Specifically, the AFO specialist may consult with the RTOC and/or the Technical Professional and may obtain a simulation of the subterranean operations using a slightly over-gauge hole and compare the results with the actual PWD data to characterize the hole enlargement. In certain embodiments, the AFO specialist may have a logger or mud engineer physically log the hole by pumping an indicator downhole and determining how long it takes the indicator to return to the surface. The time it takes the indicator to return to the surface together with information regarding the pump efficiency may be used to calculate the hole volume and identify an enlarged hole. In certain embodiments, once in step 1008 the AFO specialist identifies a hole enlargement or once the hole enlargement is characterized in step 1006, the process may be directed to the intervention workflow of FIG. 3 and an appropriate intervention signal may be documented. The process then returns to step 1004 where the AFO specialist continues to monitor the subterranean operations to detect another potential wellbore enlargement condition.

Figure 11:
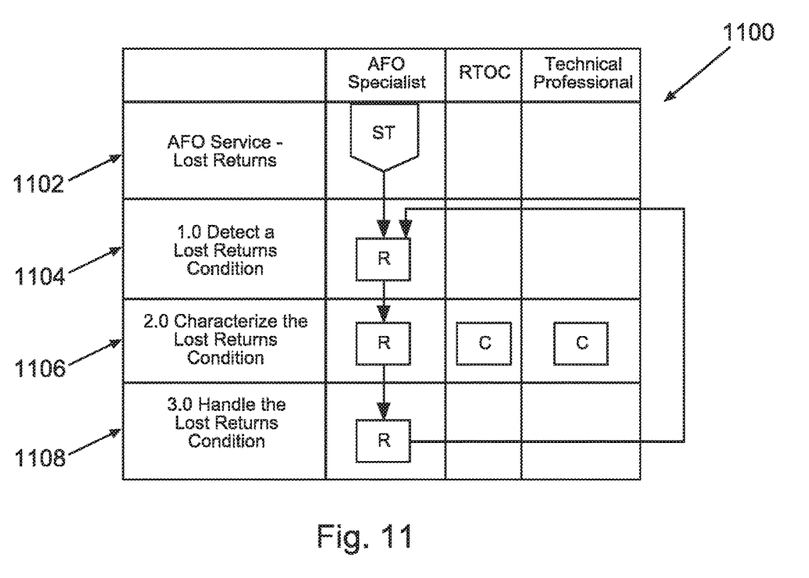
FIG. 11 depicts an AFO service for monitoring lost returns in accordance with an exemplary embodiment of the present disclosure.

Turning now to FIG. 11, an AFO service for monitoring lost returns is denoted generally with reference numeral 1100. Generally, lost returns refers to a condition where the formation cannot withstand the wellbore pressure and hydrocarbons being produced from a subterranean formation are forced into the formation instead of being returned to the surface. In accordance with an embodiment of the present disclosure, the AFO service is initiated by the AFO specialist at step 1102 and monitors the operations until a lost returns condition is detected at step 1104. For instance, a drop in pit volume may be an indication of a lost returns condition. The AFO specialist may also verify the existence of a lost returns condition with the rig. Next, at step 1106, the AFO specialist may characterize the lost returns condition. Specifically, the AFO specialist may analyze the pressure readings from the wellbore and look for spikes in pressure and/or the ECD. Next, at step 1108 the AFO specialist may report its findings, analysis, and conclusions to the appropriate personnel. In certain embodiments, once in step 1108 the AFO specialist identifies a lost returns condition or once the lost returns condition is characterized in step 1106, the process may be directed to the intervention workflow of FIG. 3 and an appropriate intervention signal may be documented. The process then returns to step 1104 where the AFO specialist continues to monitor the subterranean operations to detect another potential lost returns condition.

Similarly, the AFO services may be used to monitor other operating conditions of significance such as, for example, a plugged bit nozzle, bit/Bottom Hole Assembly ("BHA") balling, and/or Barite sag. A drill bit nozzle may be plugged by materials flowing through the drillstring. This plugging may cause a sharp increase in SPP with a minimal (if any) increase in the PWD. Typically when a bit nozzle is plugged, the drillstring may be pulled out to change out the jet nozzle. A bit/BHA balling condition refers to instances where materials from the formation stick to the drill bit or other components of the BHA and adversely impact the ability to drill the wellbore. This is a particularly common problem when operating in highly reactive shale. This condition is typically characterized by a reduction in the ROP. Finally, Barite sag refers to instances when the suspension properties of the drilling mud are insufficient to hold Barite in the mud and the Barite sags. This problem is of particular importance in high angle wellbores. This condition may be detected, for example, when PWD EMW is lower than previous EMW (at pumps-off) or when PWD ECDs show higher than normal separation from EMWs at pumps-on, tapering to a nominal ECD after circulation is established. The AFO specialist may handle a Barite sag condition by increasing the mud's gel strength.

In accordance with an embodiment of the present disclosure, the AFO specialist may utilize the intervention workflow method of FIG. 3 and an appropriate intervention signal may be documented in response to a plugged bit nozzle, bit/BHA balling and/or Barite sag.

Accordingly, as would be appreciated by those of ordinary skill in the art, with the benefit of this disclosure, data available from the IDE 200 may improve drilling and fluid performance. As a result, operational decisions may be made quickly and may be based on current, real-time data. Additionally, utilizing the IDE 200 will help eliminate or reduce the number of personnel needed at dangerous work locations and help an operator prioritize which locations require more attention and personnel than others. Moreover, in the case of land-based operations, the use of the IDE 200 may provide around the clock access to drilling parameters and drilling fluid properties which may empower a mud engineer to make better decisions to construct a wellbore with little intervention.

As would be appreciated by those of ordinary skill in the art, with the benefit of this disclosure, one or more information handling systems may be used to implement the methods disclosed herein. In certain embodiments, the different information handling systems may be communicatively coupled through a wired or wireless system to facilitate data transmission between the different subsystems. Moreover, each information handling system may include a computer readable media to store data generated by the subsystem as well as preset job performance requirements and standards.

Therefore, the present invention is well-adapted to carry out the objects and attain the ends and advantages mentioned as well as those which are inherent therein. While the invention has been depicted and described by reference to exemplary embodiments of the invention, such a reference does not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects. The terms in the claims have their plain, ordinary meaning unless otherwise explicitly and clearly defined by the patentee.

What is claimed is:

1. A method of optimizing performance of subterranean operations comprising:
collecting sensor data via sensors located at a rig during a subterranean operation being performed via components on the rig, wherein the sensors comprise a plurality of sensors detecting hole depth, bit depth, block position, True Vertical Depth (TVD), density and/or fluid flow of fluid directed into one or more components performing the subterranean operation, density and/or fluid flow directed out of one or more components performing the subterranean operation, stand pipe pressure, rotations per minute (RPM), torque, bottom hole temperature (BHT), running speed, unit of gas, and pressure while drilling (PWD);
communicating the sensor data to an applied fluid optimization (AFO) specialist comprising a centralized information handling system;
monitoring performance of the subterranean operation via the AFO specialist;
determining whether the subterranean operation is being performed at an optimal level via the AFO specialist;
identifying one or more causes for the subterranean operation not being performed at an optimal level via the AFO specialist;
determining a level of intervention based on the one or more causes for the subterranean operation not being performed at an optimal level; and
generating an intervention having the determined level via the AFO specialist if the subterranean operation is not being performed at an optimal level; and
wherein the level of intervention is selected from a group consisting of a low level intervention, a medium level intervention, and a high level intervention, wherein determining the level of intervention comprises:
determining whether simulated data from a software application of the AFO specialist is correct by comparing the simulated data with data received from at least one of the plurality of sensors;
generating the low level intervention when the simulated data is determined to be incorrect;
generating the medium level intervention when the simulated data is determined to be correct and is indicative of a condition that could lead to an adverse event; and
generating the high level intervention when the simulated data is determined to be correct and is indicative of an adverse event happening concurrently.

2. The method of claim 1, wherein determining whether the subterranean operation is being performed at an optimal level comprises:
generating simulated rig data based at least on the detected hole depth, bit depth, block position, TVD, and running speed, wherein the simulated rig data comprises downhole pressures, mud weight, and drilahead hydraulics; and comparing the simulated rig data with actual rig data, wherein the actual rig data comprises at least the detected PWD.

3. The method of claim 1, further comprising communicating the intervention having the intervention level from the AFO specialist to a Point of Contact, wherein the Point of Contact handles the intervention.

4. The method of claim 1, wherein the subterranean operation is selected from a group consisting of a drilling operation and a hole cleaning operation.

5. The method of claim 4, wherein the subterranean operation is the drilling operation, wherein determining whether the subterranean operation is being performed at an optimal level comprises comparing one or more simulated drilling parameters with actual drilling parameters; and wherein the drilling parameters are selected from a group consisting of downhole pressure, mud weight, drillahead hydraulics, flow rates, standpipe pressure, unit of gas, rate of penetration, torque and a combination thereof.

6. The method of claim 4, wherein the subterranean operation is the hole cleaning operation; wherein the hole cleaning operation is performed by a rig; and wherein determining whether the subterranean operation is being performed at an optimal level comprises determining whether the rig is sliding.

7. The method of claim 1, wherein determining whether the subterranean operation is being performed at an optimal level comprises determining whether there is at least one of an excessive surge pressure, an excessive swab pressure, influx, Pack-Off, wellbore breathing, hole enlargement, lost returns, and a combination thereof.

8. A method of optimizing performance of a subterranean operation comprising:
providing a plurality of sensors at a rig used to perform a subterranean operation;
wherein the plurality of sensors gather sensor data relating to performance of the subterranean operation, wherein the plurality of sensors detect hole depth, bit depth, block position, True Vertical Depth (TVD), density and/or fluid flow of fluid directed into one or more components performing the subterranean operation, density and/or fluid flow of fluid directed out of one or more components performing the subterranean operation, stand pipe pressure, rotations per minute (RPM), torque, bottom hole temperature (BHT), running speed, unity of gas, and pressure while drilling (PWD);
monitoring the sensor data gathered by the plurality of sensors to identify one or more operational conditions via the AFO specialist;
identifying need for an intervention based on the one or more identified operational conditions via the AFO specialist;
determining an intervention level based on the gathered sensor data;
generating and communicating an intervention corresponding to the determined intervention level to a Point of Contact via the AFO specialist;
wherein the intervention level is selected from a group consisting of a low level intervention, a medium level intervention, and a high level intervention, wherein generating the level of intervention comprises:
determining whether simulated data from a software application of the AFO specialist is correct by comparing the simulated data with data received from at least one of the plurality of sensors;
generating the low level intervention when the simulated data is determined to be incorrect;
generating the medium level intervention when the simulated data is determined to be correct and is indicative of a condition that could lead to an adverse event; and
generating the high level intervention when the simulated data is determined to be correct and is indicative of an adverse event happening concurrently; and
responding to the intervention received at the Point of Contact based on the intervention level.

9. The method of claim 8, wherein the one or more operational conditions are selected from a group consisting of excessive Surge pressure, excessive Swab pressure, influx, Pack-Off, wellbore breathing, hole enlargement, and lost returns.

10. The method of claim 8, wherein the subterranean operation is a drilling operation.

11. The method of claim 8, wherein monitoring data gathered by the plurality of sensors to identify one or more operational conditions comprises comparing actual data with simulated data to identify the one or more operational conditions wherein the simulated data is generated based at least on the detected hole depth, bit depth, block position, TVD, and running speed, wherein the simulated rig data comprises downhole pressures, mud weight, and drillahead hydraulics, and wherein the actual data comprises at least the detected PWD.

12. The method of claim 8, wherein responding to the intervention based on the intervention level comprises:
probing the system to continue to monitor the identified operational condition if a low level intervention is generated;
at least one of compiling a list of mitigation options to resolve the condition and notifying an operator about the condition if a medium level intervention is generated; and
at least one of issuing a notification of a significant adverse event, compiling a list of mitigation options to resolve the condition and notifying the operator about the condition if a high level intervention is generated.

* * * * *